United States Patent
Wang et al.

(10) Patent No.: US 9,253,892 B2
(45) Date of Patent: Feb. 2, 2016

(54) PERIPHERAL CIRCUIT OF TOUCH PANEL AND MANUFACTURING METHOD THEREOF

(71) Applicant: Wistron Corporation, New Taipei (TW)

(72) Inventors: Kuei-Ching Wang, New Taipei (TW); Ta-Hu Lin, New Taipei (TW)

(73) Assignee: Wistron Corporation, Hsichih, New Taipei (TW)

( * ) Notice: Subject to any disclaimer, the term of this patent is extended or adjusted under 35 U.S.C. 154(b) by 224 days.

(21) Appl. No.: 13/858,913

(22) Filed: Apr. 8, 2013

(65) Prior Publication Data

US 2013/0269988 A1 Oct. 17, 2013

(30) Foreign Application Priority Data

Apr. 13, 2012 (TW) ............................. 101113236 A
May 18, 2012 (TW) ............................. 101117870 A

(51) Int. Cl.

| | | |
|---|---|---|
| H05K 1/03 | (2006.01) | |
| H05K 3/12 | (2006.01) | |
| H05K 1/02 | (2006.01) | |
| G06F 3/041 | (2006.01) | |
| H05K 3/02 | (2006.01) | |
| G06F 3/044 | (2006.01) | |

(Continued)

(52) U.S. Cl.
CPC .............. *H05K 3/1283* (2013.01); *G06F 3/041* (2013.01); *G06F 3/044* (2013.01); *G06F 3/045* (2013.01); *H05K 1/0296* (2013.01); *H05K 3/02* (2013.01); *G06F 2203/04103* (2013.01); *H05K 1/092* (2013.01); *H05K 2203/0514* (2013.01); *H05K 2203/1131* (2013.01); *H05K 2203/1476* (2013.01)

(58) Field of Classification Search
CPC .......... H05K 5/03; H05K 9/00; G06G 3/033; G06G 3/041; G06G 3/042; G06G 3/045; G09G 5/00
USPC ..................... 174/255; 361/679.01, 760, 816; 345/173, 87, 174, 156; 349/12, 113, 349/122, 149
See application file for complete search history.

(56) References Cited

U.S. PATENT DOCUMENTS 6,542,374 B1 * 4/2003 Muramatsu et al. ........... 361/760
7,710,400 B2 * 5/2010 Yamada et al. ................ 345/173

(Continued)

FOREIGN PATENT DOCUMENTS

| CN | 101996007 A | 3/2011 |
|---|---|---|
| CN | 102300414 A | 12/2011 |

(Continued)

OTHER PUBLICATIONS

Office action mailed on Sep. 23, 2013 for the Taiwan application No. 101113236, filing date: Apr. 13, 2012, p. 1 line 12~14, p. 2~6 and p. 7 line 1~24.

*Primary Examiner* — Xiaoliang Chen

(74) *Attorney, Agent, or Firm* — Winston Hsu; Scott Margo

(57) ABSTRACT

A method for manufacturing a peripheral circuit of a touch panel includes: printing a radiation curable conductive material on a substrate having a transparent conductive pattern; irradiating the radiation curable conductive material with a radiated ray, in order to cure parts of the radiation curable conductive material; and removing uncured parts of the radiation curable conductive material, in order to form the peripheral circuit.

4 Claims, 12 Drawing Sheets

(51) Int. Cl.
*G06F 3/045* (2006.01)
*H05K 1/09* (2006.01)

(56) References Cited

U.S. PATENT DOCUMENTS

| | | | |
|---|---|---|---|
| 7,868,957 B2* | 1/2011 | Yamazaki et al. | 349/43 |
| 8,427,446 B2 | 4/2013 | Lan | |
| 2001/0024184 A1* | 9/2001 | Maeda | 345/87 |
| 2001/0043291 A1* | 11/2001 | Kono et al. | 349/12 |
| 2002/0000979 A1* | 1/2002 | Furuhashi et al. | 345/173 |
| 2002/0005928 A1* | 1/2002 | Hanakawa et al. | 349/149 |
| 2002/0008681 A1* | 1/2002 | Hanakawa et al. | 345/87 |
| 2002/0008815 A1* | 1/2002 | Hanakawa et al. | 349/113 |
| 2002/0054261 A1* | 5/2002 | Sekiguchi | 349/122 |
| 2002/0101409 A1* | 8/2002 | Yokoyama et al. | 345/173 |
| 2002/0118325 A1* | 8/2002 | Hinata et al. | 349/113 |
| 2002/0146874 A1* | 10/2002 | Kawasaki et al. | 438/166 |
| 2003/0071796 A1* | 4/2003 | Nakanishi et al. | 345/173 |
| 2003/0201985 A1* | 10/2003 | Katakami | 345/173 |
| 2004/0009303 A1* | 1/2004 | Ito et al. | 427/421 |
| 2004/0092061 A1* | 5/2004 | Kawasaki et al. | 438/166 |
| 2004/0241344 A1* | 12/2004 | Kawanishi et al. | 428/1.1 |
| 2005/0046622 A1* | 3/2005 | Nakanishi et al. | 345/173 |
| 2005/0095356 A1* | 5/2005 | Nakamura et al. | 427/58 |
| 2006/0132450 A1* | 6/2006 | Yamada et al. | 345/173 |
| 2006/0202638 A1* | 9/2006 | Kubota et al. | 315/291 |
| 2006/0236917 A1* | 10/2006 | Denda | 117/60 |
| 2007/0013678 A1* | 1/2007 | Nakajima et al. | 345/174 |
| 2007/0085112 A1* | 4/2007 | Yamazaki et al. | 257/288 |
| 2007/0218957 A1* | 9/2007 | Nishikawa et al. | 455/566 |
| 2008/0020202 A1* | 1/2008 | Nashiki et al. | 428/337 |
| 2008/0122802 A1* | 5/2008 | Furuhashi et al. | 345/174 |
| 2009/0231301 A1* | 9/2009 | Chang et al. | 345/174 |
| 2009/0284484 A1* | 11/2009 | Hwang et al. | 345/173 |
| 2010/0001975 A1* | 1/2010 | Jiang et al. | 345/174 |
| 2010/0003502 A1* | 1/2010 | Nashiki et al. | 428/328 |
| 2010/0013784 A1* | 1/2010 | Nashiki et al. | 345/173 |
| 2010/0015417 A1* | 1/2010 | Nakajima et al. | 428/195.1 |
| 2010/0048254 A1* | 2/2010 | Jiang et al. | 455/566 |
| 2010/0182524 A1* | 7/2010 | Nomura | 349/40 |
| 2010/0200875 A1* | 8/2010 | Takei | 257/91 |
| 2010/0283755 A1* | 11/2010 | Hsih | 345/174 |
| 2011/0012865 A1* | 1/2011 | Nozawa | 345/174 |
| 2011/0097834 A1* | 4/2011 | Yamazaki et al. | 438/30 |
| 2011/0102343 A1* | 5/2011 | Imai et al. | 345/173 |
| 2011/0115738 A1* | 5/2011 | Suzuki et al. | 345/173 |
| 2011/0141065 A1* | 6/2011 | Noguchi et al. | 345/176 |
| 2011/0217548 A1* | 9/2011 | Nashiki et al. | 428/339 |
| 2011/0221702 A1* | 9/2011 | Tanaami | 345/174 |
| 2011/0227846 A1* | 9/2011 | Imazeki | 345/173 |
| 2011/0234520 A1* | 9/2011 | Chan | 345/173 |
| 2011/0242023 A1* | 10/2011 | Lee | 345/173 |
| 2011/0255227 A1* | 10/2011 | Murakami | 361/679.01 |
| 2011/0260741 A1* | 10/2011 | Weaver et al. | 324/686 |
| 2011/0304564 A1* | 12/2011 | Kim et al. | 345/173 |
| 2012/0044662 A1* | 2/2012 | Kim et al. | 361/816 |
| 2012/0075214 A1* | 3/2012 | Kim | 345/173 |
| 2012/0075237 A1* | 3/2012 | Ikeda et al. | 345/174 |
| 2012/0081333 A1* | 4/2012 | Ozeki et al. | 345/174 |
| 2012/0111718 A1* | 5/2012 | Haishi et al. | 204/192.1 |
| 2012/0114923 A1* | 5/2012 | Haishi et al. | 428/213 |
| 2012/0139829 A1* | 6/2012 | Anno et al. | 345/156 |
| 2012/0146942 A1* | 6/2012 | Kamoshida et al. | 345/174 |
| 2012/0293298 A1* | 11/2012 | Nakamura et al. | 338/211 |

FOREIGN PATENT DOCUMENTS

| | | |
|---|---|---|
| CN | 102311681 A | 1/2012 |
| TW | 201209656 | 3/2012 |
| TW | 201214032 A1 | 4/2012 |

* cited by examiner

PERIPHERAL CIRCUIT OF TOUCH PANEL AND MANUFACTURING METHOD THEREOF

BACKGROUND OF THE INVENTION

1. Field of the Invention

The present invention relates to a peripheral circuit of a touch panel and a manufacturing method thereof.

2. Description of the Prior Art

Various types of touch technology are widely applied in electronic products. For example, in mobile phones and tablets, touch panels are often utilized as an input interface. The user can use their hand to directly contact the surface of the touch panel for performing operations, or slide their hand on the surface of the touch panel to control a mouse or perform a hand-written input. A display together with the touch panel may also show a virtual keyboard for the user, and the user can input characters via corresponding keys on the virtual keyboard.

The touch panel may be divided into various types such as a resistive touch panel, capacitive touch panel, ultrasonic touch panel and infrared ray touch panel. Among these touch panels, the resistive touch panel is the most commonly utilized. The resistive touch panel may mainly be divided into a four-wire touch panel, five-wire touch panel, six-wire touch panel and eight-wire touch panel. Since the four-wire touch panel is more mature in consideration of cost and technology, it is currently the most widely manufactured. The capacitive touch panel, however, can sense a light-touch, and thus is more convenient for utilization. In addition, the capacitive touch panel rarely wears down due to finger contact. It is also more stable and has a longer life than the resistive touch panel. For these reasons, the capacitive touch panel is gradually replacing the resistive touch panel as the most commonly utilized touch panel applied in electronic products.

The touch panel includes a substrate, a transparent conductive layer formed on the substrate, a peripheral circuit and an insulating layer. The touch panel may further include a connected flexible printed circuit board (FPC). The peripheral circuit is connected with the transparent conductive layer and the FPC. The peripheral circuit can be formed by a photolithography process. The conventional photolithography process includes the following steps: first, a metal layer is formed on the substrate by deposition or electrode planting; then a photoresist layer is applied on the metal layer, and selective exposure is performed on the photoresist layer; then developing is performed on the photoresist layer after exposure with a developer, to obtain a patterned photoresist layer; finally, the patterned photoresist layer is utilized as a mask to etch the metal layer, in order to form a conductive circuit on the substrate.

When the conventional photolithography process is implemented, the steps are complex and need to utilize a large number of chemicals, such that the cost is high and the process may not comply with the requirements and trends of environmental protection emphasized in modern science and technology.

In order to solve the problems of manufacturing the peripheral circuit with the conventional photolithography process, the industry provides a manufacturing method for forming the peripheral circuit with a printing process. This method prints a thermal setting conductive adhesive on the substrate, and then cures and bakes the thermal setting conductive adhesive with a high temperature, in order to form the peripheral circuit. This manufacturing method benefits from a simplified process in comparison to the photolithography process, but the peripheral circuit formed by utilizing the printing process may come off since the adherence degree of the printing ink connected with the substrate is low, which causes the conductive circuit to be cut off. In addition, this method may only be applied in a conductive pattern and circuit with a thicker wire width and a greater wire distance, and cannot effectively enhance the density of circuit disposition.

Therefore, how to provide a peripheral circuit of a touch panel and a manufacturing method thereof which are capable of reducing wire width or wire distance in order to achieve higher integration while complying with environmental protection requirements becomes an important issue.

SUMMARY OF THE INVENTION

It is an objective of the present invention to provide a peripheral circuit of a touch panel that can be manufactured using a simplified process while maintaining the adherence degree and electronic characteristics, and a manufacturing method thereof, which can reduce wire width or wire distance in order to achieve higher integration while complying with environmental protection requirements.

In order to achieve the above objectives, a method of manufacturing a peripheral circuit of a touch panel according to the present invention comprises the following steps: printing a radiation curable conductive material on a substrate having a transparent conductive pattern; irradiating the radiation curable conductive material with a radiated ray, in order to cure parts of the radiation curable conductive material; and removing uncured parts of the radiation curable conductive material, in order to form the peripheral circuit.

According to an embodiment of the present invention, a wavelength of the radiated ray is approximately within a range from 230 nanometers to 600 nanometers.

According to an embodiment of the present invention, the transparent conductive pattern is connected with the peripheral circuit.

According to an embodiment of the present invention, a wire width of the peripheral circuit is less than or equal to about 70 micrometers.

According to an embodiment of the present invention, the radiation curable conductive material comprises radiation curable silver glue, radiation curable silver paste or radiation curable ink.

According to an embodiment of the present invention, the step of curing parts of the radiation curable conductive material comprises selectively curing the radiation curable conductive material by disposing a photomask on the radiation curable conductive material, wherein a material of the photomask comprises glass, quartz or polyethylene terephthalate (PET).

According to an embodiment of the present invention, the radiated ray irradiates the radiation curable conductive material with at least two different wavelength ranges.

According to an embodiment of the present invention, the radiation curable conductive material is printed on the substrate by screen printing.

According to an embodiment of the present invention, the substrate is a transparent plastic substrate, a transparent glass substrate or a PET thin film substrate.

In order to achieve the above objectives, a touch panel according to the present invention comprises a substrate and a peripheral circuit. The substrate has a transparent conductive pattern. The peripheral circuit is connected with the transparent conductive pattern. A material of the peripheral circuit comprises a radiation curable conductive material.

According to an embodiment of the present invention, a wire width of the peripheral circuit is less than or equal to about 70 micrometers.

According to an embodiment of the present invention, the radiation curable conductive material comprises radiation curable silver glue, radiation curable silver paste or radiation curable ink.

According to an embodiment of the present invention, the substrate is a transparent plastic substrate, a transparent glass substrate or a PET thin film substrate.

In order to achieve the above objectives, a peripheral circuit of a touch panel according to the present invention is manufactured using the above methods.

In order to achieve the above objectives, a method of manufacturing a peripheral circuit of another touch panel according to the present invention comprises the following steps: printing a photosensitive conductive material on a substrate by screen printing; disposing a photomask on the photosensitive conductive material; irradiating the photosensitive conductive material with a beam, in order to cure parts of the photosensitive conductive material; and etching uncured parts of the photosensitive conductive material, in order to form the peripheral circuit.

According to an embodiment of the present invention, the substrate is a transparent substrate.

According to an embodiment of the present invention, the photosensitive conductive material comprises a plurality of silver particles, and a diameter of the plurality of silver particles is within a range from 1 micrometer to 10 micrometers.

According to an embodiment of the present invention, a wire width of the peripheral circuit is less than 100 micrometers.

According to an embodiment of the present invention, a material of the photomask comprises glass, quartz or PET.

According to an embodiment of the present invention, the step of etching is performed by wet etching.

According to an embodiment of the present invention, the method further comprises connecting the peripheral circuit with a flexible printed circuit board (FPC) by using a conductive adhesive.

According to an embodiment of the present invention, the conductive adhesive is an anisotropic conductive film (ACF) or anisotropic conductive paste (ACP).

According to an embodiment of the present invention, the method further comprises disposing a protective film on the peripheral circuit.

According to an embodiment of the present invention, the step of disposing the protective film on the peripheral circuit comprises disposing the protective film utilizing a pasting method or a printing method.

According to an embodiment of the present invention, the beam comprises a visible light with a wavelength within a range from 350 micrometers to 780 micrometers.

As mentioned above, the peripheral circuit of the touch panel and the manufacturing method thereof according to one exemplary embodiment of the present invention utilizes radiation curable conductive material as a printing material to be printed on the substrate, cures parts of the radiation curable conductive material, and then removes uncured parts of the radiation curable conductive material in order to form the peripheral circuit. These steps can realize the reduction of wire width or wire distance in order to achieve higher integration while complying with environmental protection requirements. The peripheral circuit of the touch panel and the manufacturing method thereof according to another exemplary embodiment of the present invention utilizes photosensitive conductive material as a printing material to be printed on the substrate, cures parts of the photosensitive conductive material, and then etches uncured parts of the photosensitive conductive material in order to form the peripheral circuit. These steps can realize the simplification of the manufacturing process while retaining the adherence degree and electronic characteristics. For the implementation of the present invention, the manufacturing method enjoys the benefits of screen printing and exposure/development; hence power consumption problems can be avoided, as opposed to the conventional thermal curing process where the power consumption is generated by using an oven for a long time. Therefore, the environmental protection requirements can also be met.

In summary, the peripheral circuit of the touch panel and the manufacturing method thereof according to the present invention enjoy the benefits of screen printing and exposure/development, which not only can manufacture the touch panel at a low cost and high speed, but can also provide the touch panel with the advantages of small wire width and wire distance. This method is therefore suitable for smaller electronic devices. The peripheral circuit of the touch panel and the manufacturing method thereof according to the present invention can enlarge the visible area, which provides greater convenience for the user.

These and other objectives of the present invention will no doubt become obvious to those of ordinary skill in the art after reading the following detailed description of the preferred embodiment that is illustrated in the various figures and drawings.

DETAILED DESCRIPTION

In the following, the description refers to illustrations related to a peripheral circuit of a touch panel and a manufacturing method thereof according to preferable embodiments of the present invention, where the same elements are denoted by the same reference symbols.

Figure 1A:
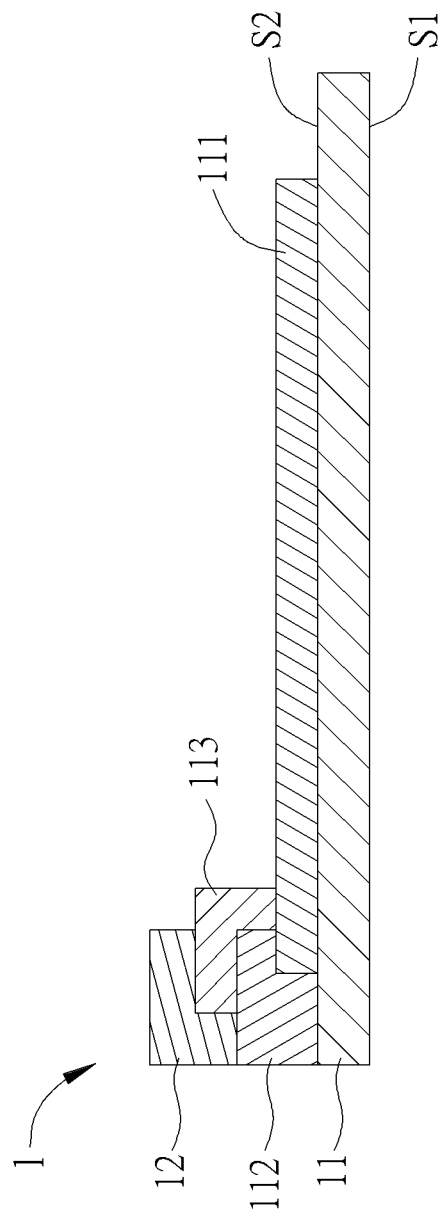
FIG. 1A and FIG. 1B are schematic diagrams of a touch panel according to a preferable embodiment of the present invention.
Figure 1B:
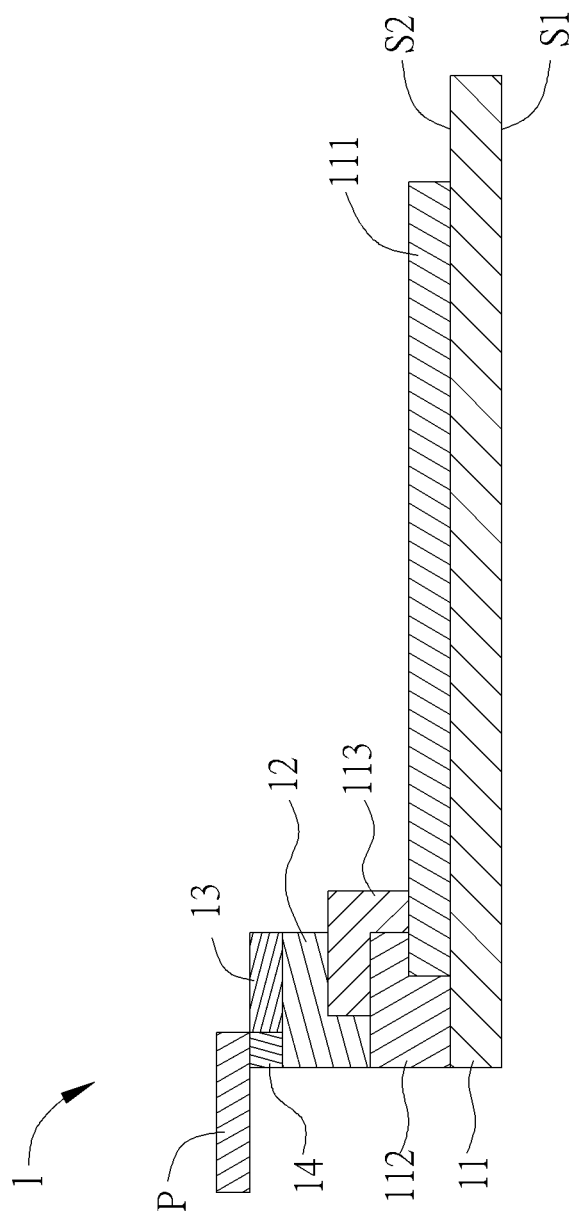

Please refer to FIG. 1A and FIG. 1B, which are schematic diagrams of a touch panel 1 according to a preferable embodiment of the present invention. The touch panel 1 includes a substrate 11 and a peripheral circuit 12. The substrate 11 can be, for example, a transparent plastic substrate or a transparent glass substrate. In addition, the substrate 11 can also be a polyethylene terephthalate (PET) thin film substrate or other thin film-shaped substrates. The substrate 11 has an outer surface S1 and an inner surface S2. The user usually views the touch panel 1 from the outer surface S1 side, and performs various kinds of operations on the outer surface S1. Other structures and elements of the touch panel 1 are disposed on the inner surface S2 side of the substrate 11.

The inner surface S2 of the substrate 11 includes a transparent conductive pattern 111, a masking decoration layer 112 and a conductive layer 113. The transparent conductive pattern 111, disposed on the inner surface S2 of the substrate 11, is utilized for defining a touch sensing circuit. The material of the transparent conductive pattern 111 can be, for example, indium tin oxide (ITO). The masking decoration layer 112 is disposed next to a terminal of the transparent conductive pattern 111, and the material of the masking decoration layer 112 can be, for example, an insulating material or insulating ink with various colors. The conductive layer 113 is disposed on the masking decoration layer 112 and the transparent conductive pattern 111, and extends from a terminal of the transparent conductive pattern 111 to the masking decoration layer 112. The material of the conductive layer 113 includes a transparent high molecular conductive material or ITO, and the conductive layer 113 may be formed on the masking decoration layer 112 and the transparent conductive pattern 111 by printing.

The peripheral circuit 12 is disposed on the conductive layer 113 and the masking decoration layer 112, and extends to the conductive layer 113 without exceeding an edge of the masking decoration layer 112. In other words, projection of the peripheral circuit 12 is located on the masking decoration layer 112, or is flush with the edge of the masking decoration layer 112. The material of the peripheral circuit 12 is a radiation curable conductive material, which can be, for example, radiation curable silver glue, radiation curable silver paste or radiation curable ink. Fine circuits of the peripheral circuit 12 are defined by using screen printing equipment together with a screen with fine wires, and are formed on the transparent conductive pattern 111 and the masking decoration layer 112 by printing. Please note that, in the above process, the radiation curable conductive material may preferably be disposed as block-shaped circuits on the substrate printed directly by the printing equipment. In this process, no fine wire mesh needs to be utilized, and the printed block-shaped circuits may further be utilized for forming finer circuits in cooperation with lithography technique. Such implementation allows the wire width of the peripheral circuit 12 to be less than or equal to 70 micrometers, and reduces the requirements for high precision screens, which favors cost reduction and quality enhancement. The following paragraphs will detail how to cooperate with the lithography technique, and the photolithography technique in particular.

The above radiation curable conductive material is not limited to be composed of some special elements. The radiation curable conductive can be a material which has a certain conductivity and will be dried or cured after being irradiated by a short wavelength radiated ray. Specifically, the radiation curable conductive material can be an ultraviolet radiation cured conductive material or an ultraviolet radiation dried conductive material, which is liquid or adherent when printed, where parts of the material which are irradiated by the ultraviolet radiation will be dried or cured immediately and adhered to the substrate. The non-irradiated parts will still be liquid or adherent, and can be removed easily. In addition, conductive materials which are dried or cured when irradiated by radiated rays with other wavelengths may also be utilized. The above is therefore not limited to ultraviolet radiation.

As shown in FIG. 1B, the touch panel 1 may further include an insulating layer 13 and a conductive adhesive 14. The insulating layer 13 covers parts of the peripheral circuit 12 by screen printing, in order to prevent the peripheral circuit 12 from being oxidized due to exposure to the air. The conductive adhesive 14 is adhered to the peripheral circuit 12 and a pin P of a flexible printed circuit board (FPC), such that the touch sensing signals generated by the transparent conductive pattern 111 can be transmitted to the pin P of the FPC via the conductive layer 113, the peripheral circuit 12 and the conductive adhesive 14. In other embodiments, the conductive adhesive 14 may be an anisotropic conductive film (ACF) or anisotropic conductive paste (ACP). When the touch panel is applied, the insulating layer may also be ignored, which is not limited herein.

Please note that the transparent conductive pattern 111 in this embodiment is formed on the substrate 11 directly, and the substrate 11 belongs to a type having touch sensing functions and a cover plate simultaneously. The application is not limited to this, and various types of touch panels can be applied according to the present invention. For example, a substrate with a two-layer structure composed of two substrates may also be applied in the present invention, where the top layer substrate and the bottom layer substrate both possess the transparent conductive pattern.

Figure 2A:
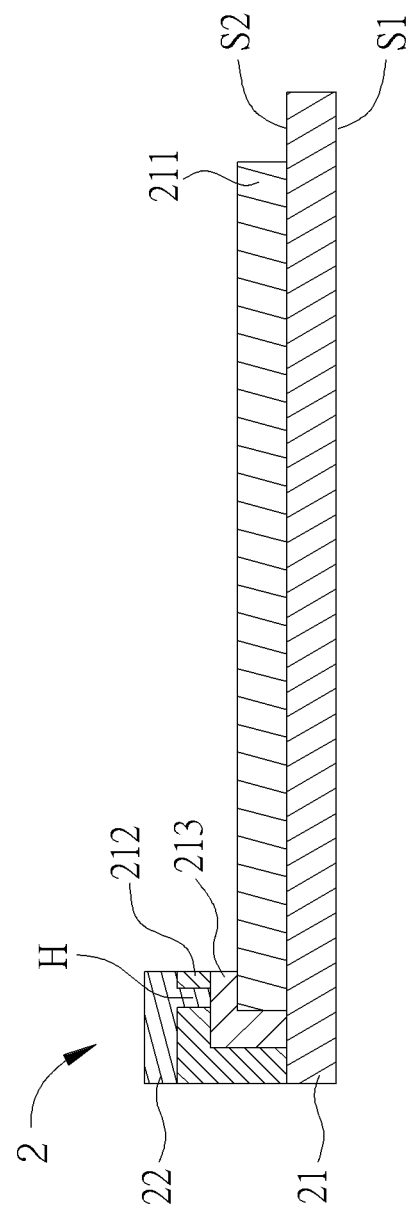
FIG. 2A and FIG. 2B are schematic diagrams of another touch panel according to a preferable embodiment of the present invention.
Figure 2B:
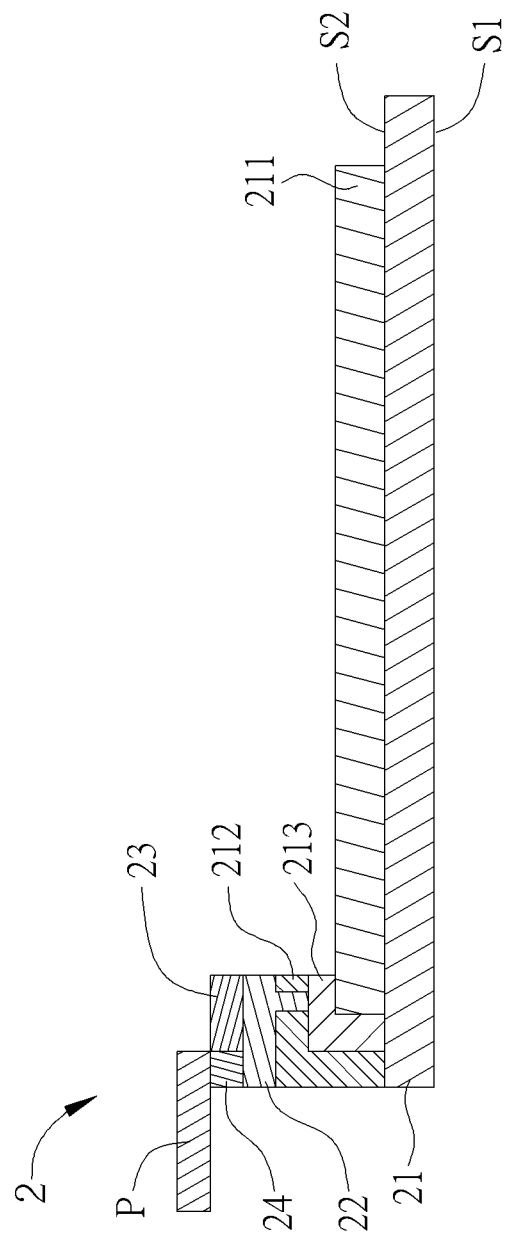

Please refer to FIG. 2A and FIG. 2B, which are schematic diagrams of another touch panel 2 according to a preferable embodiment of the present invention. The touch panel 2 includes a substrate 21 and a peripheral circuit 22. The substrate 21 can be a transparent substrate, which can be, for example, a plastic substrate or a glass substrate. The substrate 21 may also be other types such as a PET thin film substrate or other thin film-shaped substrates. The user usually views the touch panel 2 from the outer surface S1 side of the substrate 21 and performs various kinds of operations on the outer surface S1. Other structures and elements of the touch panel 2 are disposed on the inner surface S2 side of the substrate 21.

The inner surface S2 of the substrate 21 includes a transparent conductive pattern 211, a masking decoration layer 212 and a conductive layer 213. The transparent conductive pattern 211 is utilized for defining a touch sensing circuit. The material of the transparent conductive pattern 211 can be, for example, ITO. The conductive layer 213 is disposed on the substrate 21, and extends to a terminal of the transparent conductive pattern 211 to cover parts of the transparent conductive pattern 211. The masking decoration layer 212 is disposed on the substrate 21 and the conductive layer 213 and extends to the conductive layer 213. The masking decoration layer 212 possesses an opening H on the conductive layer 213, where the masking decoration layer 212 is disposed without exceeding an edge of the conductive layer 213.

The material of the conductive layer 213 includes conductive carbon paste, and the material of the masking decoration layer 212 can be, for example, an insulating material or insulating ink with various colors. For color selection of the masking decoration layer 212, a color similar to that of the conductive layer 213 is preferably selected to be utilized, such that the user may not feel the difference of color between the masking decoration layer 212 and the conductive layer 213 when viewing the outer surface S1 of the touch panel 2. In addition, the conductive layer 213 and the masking decoration layer 212 may be formed on the substrate 21 by printing.

The peripheral circuit 22 is disposed on the masking decoration layer 212, and a part of the peripheral circuit 22 is filled in the opening H and coupled to the conductive layer 213. The material of the peripheral circuit 22 is a radiation curable conductive material, which can be, for example, radiation curable silver glue, radiation curable silver paste or radiation curable ink. The peripheral circuit 12 is formed on the masking decoration layer 212 by printing and irradiating of a radiated ray.

As shown in FIG. 2B, the touch panel 2 further includes an insulating layer 23 and a conductive adhesive 24. The insulating layer 23 is disposed on the peripheral circuit 22, in order to prevent the peripheral circuit 22 from being oxidized due to exposure to the air. The conductive adhesive 24 is adhered to the peripheral circuit 22 and a pin P of an FPC. The pin P is coupled to the conductive layer 213 via the conductive adhesive 24 and the peripheral circuit 22, in order to receive the touch sensing signals generated by the transparent conductive pattern 211, where the conductive adhesive 24 can be ACF or ACP. In other embodiments, the insulating layer may also be ignored, which is not limited herein.

Figure 3:
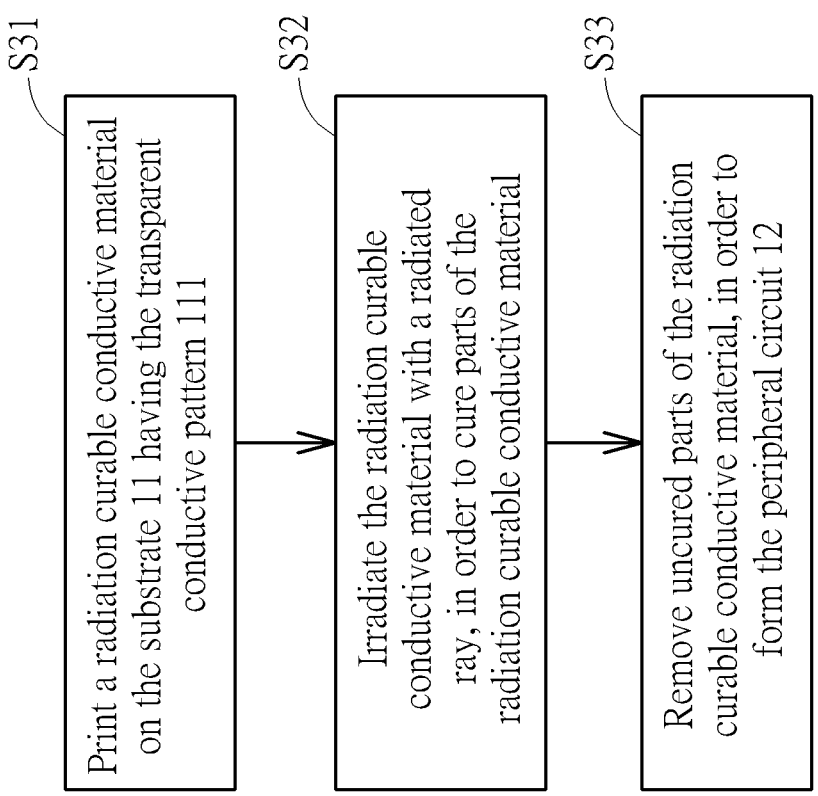
FIG. 3 is a block diagram of a method of manufacturing the peripheral circuit of the touch panel according to a preferable embodiment of the present invention.

Please refer to the block diagram shown in FIG. 3 together with FIG. 1A, which illustrates a method of manufacturing the peripheral circuit of the touch panel according to a preferable embodiment of the present invention. This method can be applied for manufacturing the abovementioned peripheral circuit 12 of the touch panel 1. The steps of the manufacturing method include Steps S31-S33.

Step S31 is printing a radiation curable conductive material on the substrate 11 having the transparent conductive pattern 111. For the implementation of Step S31, at least two methods may be included. One of the methods is forming the radiation curable conductive material on the transparent conductive pattern 111 and the masking decoration layer 112 of the substrate 11 by printing (especially screen printing) by using screen printing equipment in cooperation with a fine wire mesh, wherein the fine wires printed on the radiation curable conductive material are processed by follow-up radiation, in order to form the finer peripheral circuit 12. The second preferable method is printing the radiation curable conductive material on the substrate 11 directly by blocks or areas where the fine wire mesh is not utilized, and the follow-up operations are then performed on the formed pattern, in order to form a plurality of wires of the peripheral circuit 12.

The abovementioned radiation curable conductive material can be radiation curable silver glue, radiation curable silver paste or radiation curable ink. The substrate 11 is a transparent substrate, which can be, for example, a plastic substrate or a glass substrate. In other cases, the substrate 11 may also be PET thin film substrate or other thin film-shaped substrates. The material of the transparent conductive pattern 111 can be, for example, ITO, and the material of the masking decoration layer 112 can be, for example, an insulating material or insulating ink with various colors. The transparent conductive pattern 111 may first be formed on the substrate 11 by sputtering and etching, and the masking decoration layer 112 may be disposed on the substrate 11 by deposition or printing according to its material.

Step S32 is irradiating the radiation curable conductive material with a radiated ray, in order to cure parts of the radiation curable conductive material. For the implementation of Step S32, the radiation curable conductive material is irradiated by a radiated ray having a wavelength within a range from 230 nanometers to 600 nanometers. In order to regulate the position of the circuit layout, the method for curing parts of the radiation curable conductive material is performed by disposing a photomask on the radiation curable conductive material, which allows the radiated ray to cure the radiation curable conductive material selectively according to product requirements or circuit designs. The material of the above photomask includes glass, quartz or PET, and the form of photomask can be, but is not limited to, positive or negative, which is determined according to the nature of the material and the structural requirements of the peripheral circuit 12.

In order to enhance the integration of the radiation curable conductive material connected with the transparent conductive pattern 111 and the masking decoration layer 112, and accelerate the speed for curing the radiation curable conductive material, the radiated ray may irradiate the radiation curable conductive material in at least two phases. During these two phases of irradiation, the radiated ray may have two different wavelength ranges. For example, the radiation curable conductive material may first be irradiated by the radiated ray with a wavelength range from 300 nanometers to 400 nanometers, and then be irradiated by the radiated ray with a wavelength range from 230 nanometers to 600 nanometers. Please note that the above wavelength ranges are only an exemplary illustration, and are not utilized for limiting the present invention.

Step S33 is removing uncured parts of the radiation curable conductive material, in order to form the peripheral circuit 12. For the implementation of Step S33, the uncured parts of the radiation curable conductive material may be removed by, for example, pure water, such that the peripheral circuit 12 can be formed by the cured parts of the radiation curable conductive material. The peripheral circuit 12 is connected with the transparent conductive pattern 111, and transmits the touch sensing signals generated by the transparent conductive pattern 111 to an FPC. Since printing and parts of the photolithography process are integrated according to the present invention, the peripheral circuit 12 can be manufactured in an easy and low cost way, and the formed wire width can be less than or equal to about 70 micrometers, which enhances the integration. The utilization of a large number of chemicals is excluded in the present invention, which not only simplifies the process significantly, but also complies with environmental protection and power saving.

The peripheral circuit 22 of the other touch panel 2 provided by the present invention may also be manufactured by the above methods, and both the structure characteristics and the process can be known by referring to the above illustration. These will not be narrated herein.

The above peripheral circuit of the touch panel and the manufacturing method thereof according to the present invention utilizes radiation curable conductive material as a printing material to be printed on the substrate, cures parts of the radiation curable conductive material, and then removes uncured parts of the radiation curable conductive material in order to form the peripheral circuit, which realizes the reduction of wire width or wire distance in order to achieve higher integration while complying with environmental protection requirements. In addition to utilizing the radiation cured material as the above conductive material, other types of conductive materials may also be realized. What follows is an embodiment utilizing a photosensitive material as the conductive material, which is cured by a visible light in order to form the peripheral circuit.

Figure 4A:
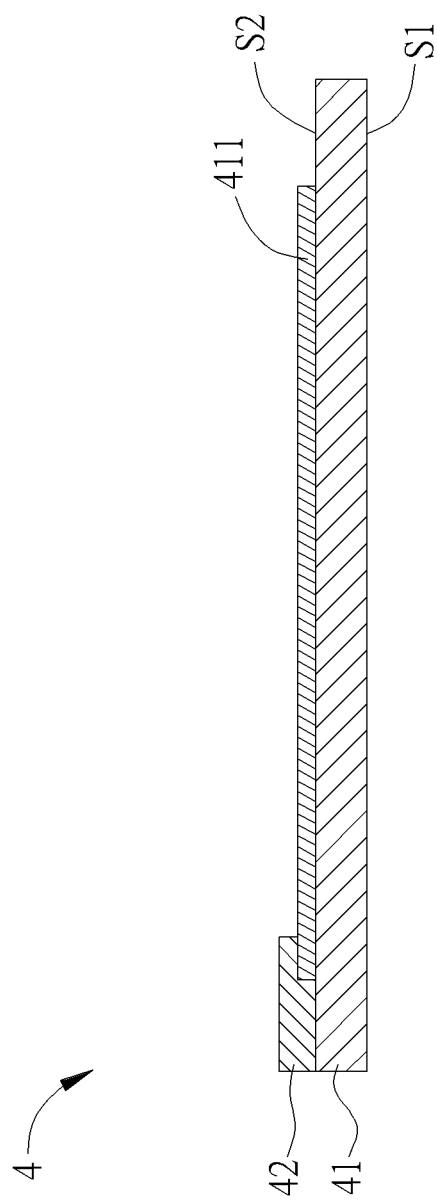
FIG. 4A to FIG. 4D are schematic diagrams of another touch panel according to a preferable embodiment of the present invention.

Please refer to FIG. 4A, which is a schematic diagram of a further touch panel 4 according to a preferable embodiment of the present invention. The touch panel 4 includes a substrate 41 and a peripheral circuit 42. The substrate 41 is a transparent substrate, which can be, for example, a plastic substrate or a glass substrate. In other embodiments, the substrate 41 may also be a thin film-shaped substrate such as a PET thin film, etc. In order to take advantage of the exposure and development process in which a high temperature baking process is not required, the substrate 41 can preferably be a thin film substrate having flexibility, which is called a flexible substrate, but is not limited herein.

The substrate 41 has an outer surface S1 and an inner surface S2. The user usually views the touch panel 4 from the outer surface S1 side of the substrate 41, and performs various kinds of operations on the outer surface S1. Other structures and elements of the touch panel 4 are disposed on the inner surface S2 side of the substrate 41. In this embodiment, the inner surface S2 of the substrate 41 includes a transparent conductive layer 411. The transparent conductive layer 411 is utilized for defining a touch sensing circuit, and the material of the transparent conductive layer 411 can be, for example, ITO.

The peripheral circuit 42 is disposed on the inner surface S2 of the substrate 41, and is placed next to a terminal of the transparent conductive layer 411 by screen printing. The material of the peripheral circuit 42 is a photosensitive conductive material, which includes a photosensitive resin composition and a plurality of silver particles. For the implementation of the peripheral circuit 42, a diameter of the silver particles is within a range from 1 micrometer to 10 micrometers, and more preferably, within a smaller range from 1 micrometer to 5 micrometers; it may also be blended with several nanometer silver particles. In addition, the photosensitive resin composition is a material which may react after being irradiated by a light.

Figure 4B:
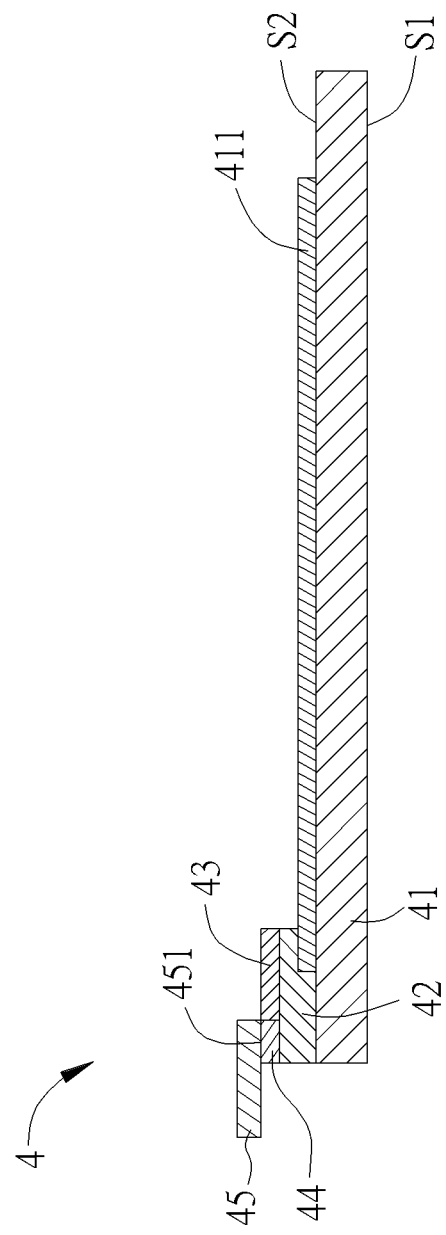

As shown in FIG. 4B, the touch panel 4 may further include an insulating layer 43, a conductive adhesive 44 and an FPC 45. The insulating layer 43 is formed on parts of the peripheral circuit 42 by pasting or printing, in order to prevent the peripheral circuit 42 from being oxidized due to exposure to the air. The color of the insulating layer 43 may also be selected according to product requirements, which allows the insulating layer 43 to be a decoration layer simultaneously. The conductive adhesive 44 is adhered to the peripheral circuit 42 and a pin 451 of the FPC 45, such that the touch sensing signals generated by the transparent conductive layer 411 can be transmitted to the pin 451 of the FPC 45 via the peripheral circuit 42 and the conductive adhesive 44. In some embodiments, the conductive adhesive 44 can be ACF or ACP.

Figure 4C:
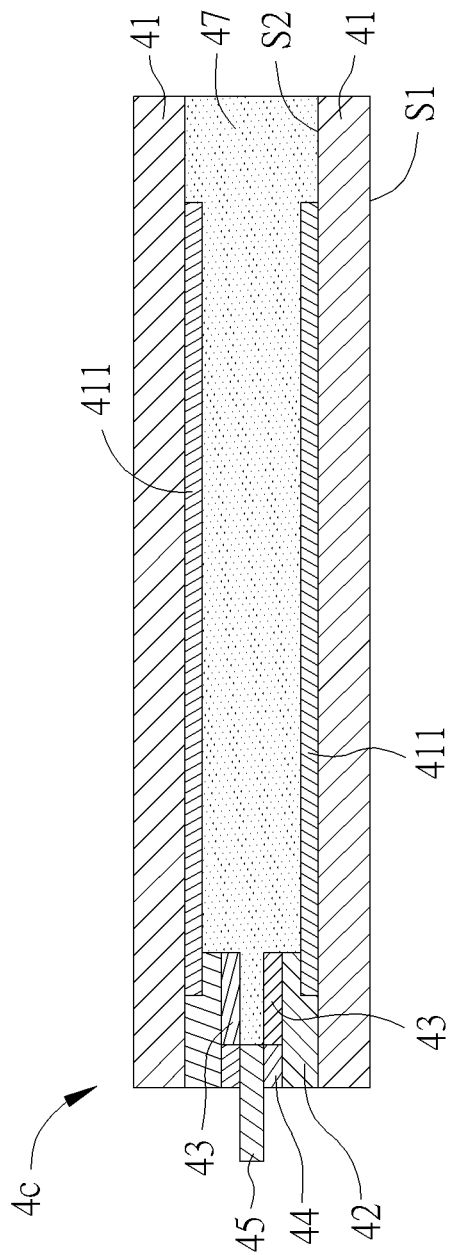

Please note that, in this embodiment, the transparent conductive layer 411 is formed on the substrate 41 directly and provides touch sensing functions independently; hence the substrate 41 in this embodiment belongs to a type having touch sensing functions and a cover plate simultaneously. According to the present invention, a two-layer touch panel 4c with a two-layer structure may also be utilized, where the two-layer touch panel 4c is composed of two substrates 41, as illustrated in FIG. 4C. The following paragraphs illustrate that the above substrate 41 with one-layer structure includes multiple functions.

After the assembly process of the substrate 41 is accomplished, only the outer surface S1 of the substrate 41 is exposed to the outside, and the transparent conductive layer 411, the peripheral circuit 42 and other structures are covered by the substrate 41. In such a condition, the substrate 41 not only can provide decoration functions and cover these elements such as the peripheral circuit 42, etc., but can also protect the peripheral circuit 42 and the transparent conductive layer 411 from damages. Moreover, the complete transparent conductive layer 411 is disposed on the substrate 41, which is enough to provide sensing functions. Therefore, the present invention realizes both the simplification of substrate process and the diversification of functions. This prospective creation of the distinguishing features is suitable for a modular process to benefit from cost reduction.

Figure 4D:
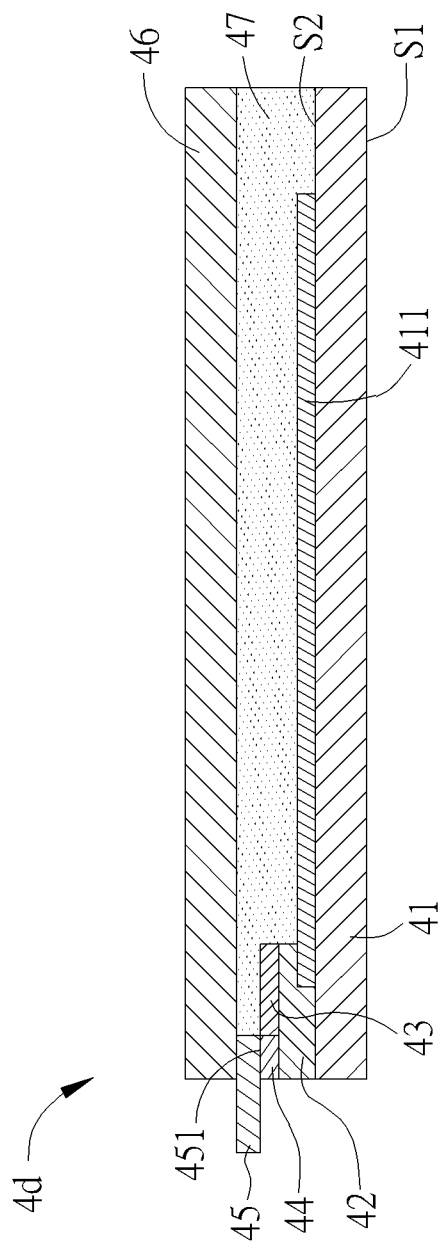

Please keep referring to FIG. 4D. A touch panel 4d is substantially the same as the above touch panel 4 shown in FIG. 4B, and the only difference is that the touch panel 4d further includes a protective film 46. The protective film 46 may be formed on the peripheral circuit 42 and the transparent conductive layer 411 by pasting or printing, in order to cover these two elements and provide protection and decoration functions. The protective film 46 can be adhered to the substrate 41 stably by adding an optical clear adhesive (OCA) 47.

Figure 5:
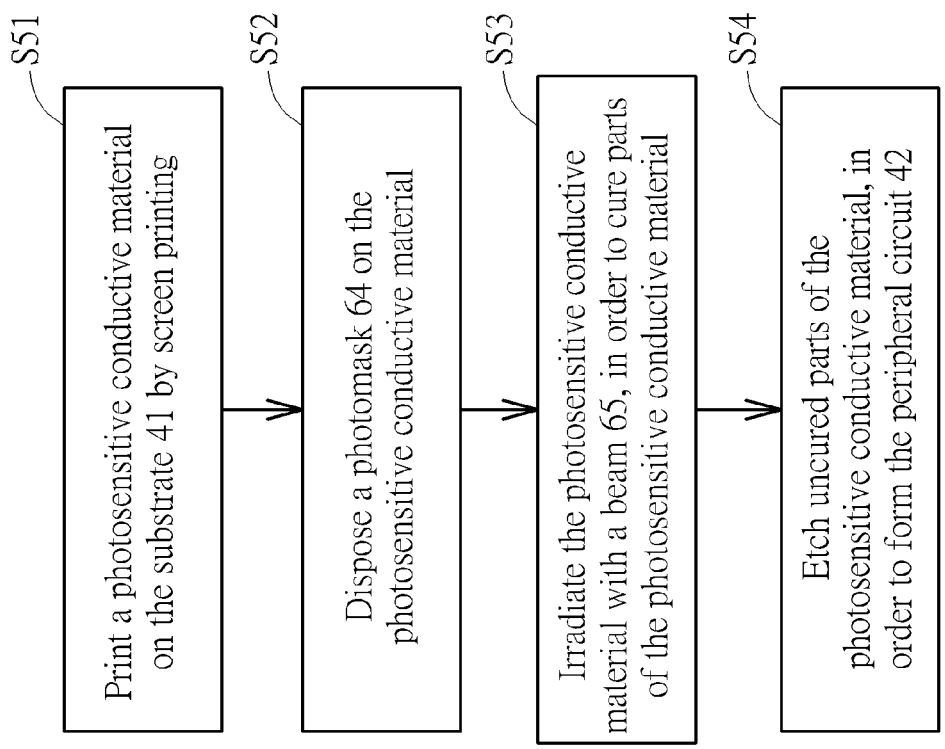
FIG. 5 is a block diagram of a method of manufacturing the peripheral circuit of the touch panel according to a preferable embodiment of the present invention.

Please refer to the block diagram shown in FIG. 5 together with FIG. 4A, which illustrates a method of manufacturing the peripheral circuit of the touch panel according to a preferable embodiment of the present invention. This method can be applied for manufacturing the abovementioned peripheral circuit 42 of the touch panel 4. The steps of the manufacturing method include Steps S51-S54.

Figure 6A:
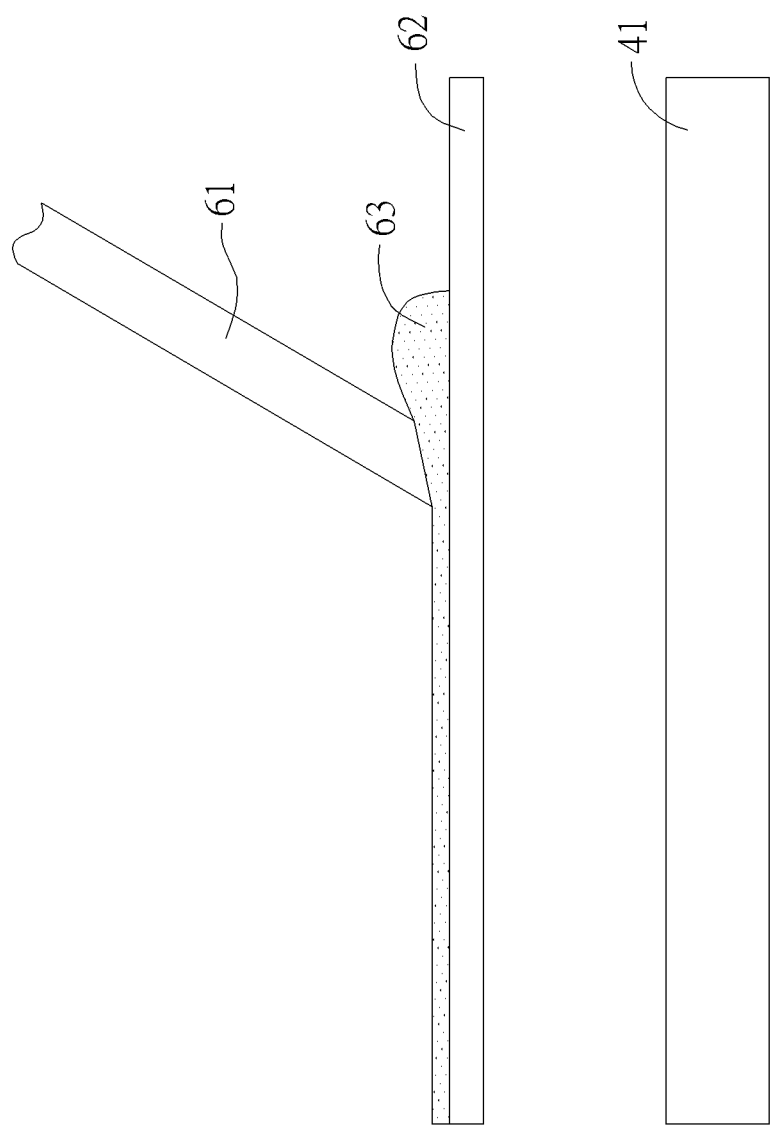
FIG. 6A and FIG. 6B are schematic diagrams of another touch panel according to a preferable embodiment of the present invention.

Step S51 is printing a photosensitive conductive material on the substrate 41 by screen printing. As shown in FIG. 6A, for the implementation of Step S51, a photosensitive conductive material 63 is formed on the transparent conductive layer 411 of the substrate 41 by printing via screen printing equipment composed of a scraper 61 and a screen 62. In detail, the screen printing equipment prints the photosensitive conductive material 63 on the substrate 41 by blocks or areas.

The above photosensitive conductive material 63 includes a photosensitive resin composition and a plurality of silver particles. A diameter of the silver particles is within a range from 1 micrometer to 10 micrometers, and more preferably within a range from 1 micrometer to 5 micrometers. The substrate 41 is a transparent substrate, which can be, for example, a plastic substrate or a glass substrate. The material of the transparent conductive layer 411 can be, for example, ITO. The transparent conductive layer 411 may first be formed on the substrate 41 by sputtering and etching.

Figure 6B:
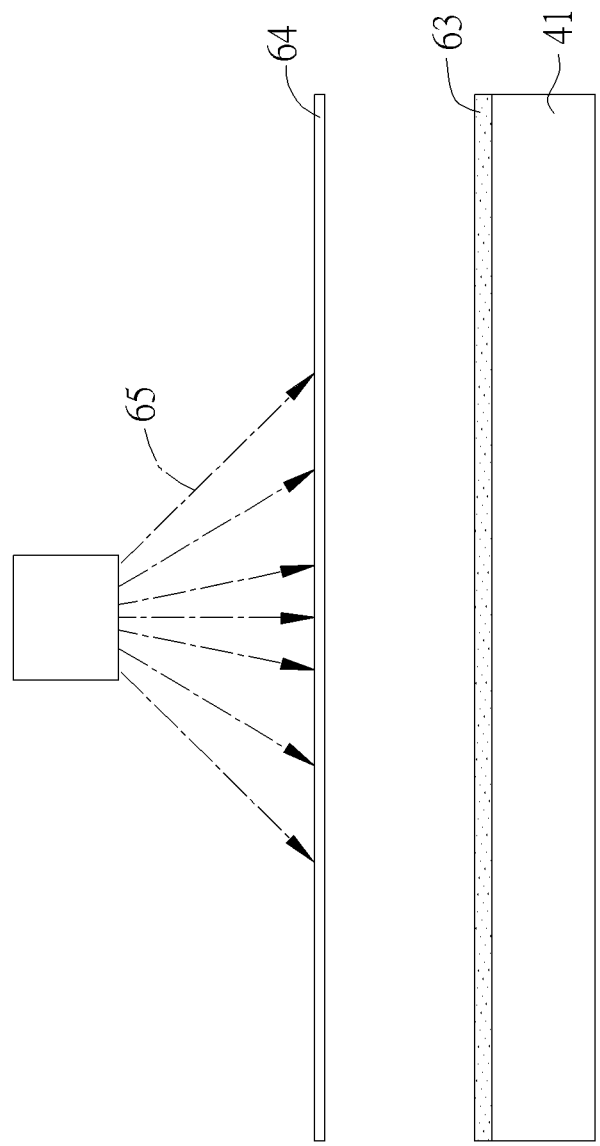

Step S52 is disposing a photomask 64 on the photosensitive conductive material. In order to regulate the position of the circuit layout, the photomask 64 is disposed on the photosensitive conductive material 63 for the implementation of Step S52, as illustrated in FIG. 6B. The material of the above photomask includes glass, quartz or PET, and the form of the photomask 64 can be, but is not limited to, positive or negative, which is determined according to the nature of the material and the structural requirements of the peripheral circuit 42.

Step S53 is irradiating the photosensitive conductive material with a beam 65, in order to cure parts of the photosensitive conductive material. For the implementation of Step S53, a light wave generation apparatus is utilized for generating the beam 65, which selectively irradiates the photosensitive conductive material 63 via the photomask 64, as illustrated in FIG. 6B. The beam 65 can be, for example, a visible light, which has a wavelength within a range from 350 nanometers to 780 nanometers.

Step S54 is etching uncured parts of the photosensitive conductive material, in order to form the peripheral circuit 42. For the implementation of Step S54, for example, developer may be utilized for etching the uncured parts of the photosensitive conductive material, in order to remove the uncured parts of the photosensitive conductive material and form the peripheral circuit 42 with the cured parts of the photosensitive conductive material. The peripheral circuit 42 is connected with the transparent conductive layer 411, wherein a wire width of the peripheral circuit 42 may be less than 100 micrometers and a wire distance of the peripheral circuit 42 may be less than 120 micrometers.

Please refer to FIG. 4D. In this structure, the method of manufacturing the peripheral circuit of the touch panel 4d further includes: adhering the peripheral circuit 42 to the FPC 45 by using the conductive adhesive 44, and disposing the protective film 46 on the peripheral circuit 42. For the implementation of these steps, the protective film 46 may be formed on parts of the peripheral circuit 42 and the transparent conductive layer 411 by pasting or printing, in order to prevent the peripheral circuit 42 from being touched or oxidized due to exposure to the air directly. The color of the protective film 46 may also be selected according to product requirements, which allows the protective film 46 to be a decoration layer simultaneously, in order to prevent the user from viewing the inside circuits.

The conductive adhesive 44 is adhered to the peripheral circuit 42 and the pin 451 of the FPC 45, such that the touch sensing signals generated by the transparent conductive layer 411 can be transmitted to the pin 451 of the FPC 45 via the peripheral circuit 42 and the conductive adhesive 44. In some embodiments, the conductive adhesive 44 can be ACF or ACP.

The above peripheral circuit of the touch panel and the manufacturing method thereof according to the present invention utilizes photosensitive conductive material as a printing material to be printed on the substrate, cures parts of the photosensitive conductive material, and then etches uncured parts of the photosensitive conductive material in order to form the peripheral circuit, which realizes the simplification of the manufacturing process while retaining the adherence degree and electronic characteristic.

In summary, the peripheral circuit of the touch panel and the manufacturing method thereof according to the present invention enjoy the benefits of screen printing and exposure/development, ensuring that not only can the touch panel be manufactured at a low cost and high speed, but that the touch panel is also provided with the advantages of small wire width and wire distance. Therefore, this method is suitable for smaller electronic devices, while overcoming the barriers of the conventional processes. The method of manufacturing the peripheral circuit of the touch panel utilizing a printing technique according to the present invention can minimize the wire width and the wire distance of the peripheral circuit, in order to achieve a fine wire width process to enhance the resolution. The peripheral circuit of the touch panel and the manufacturing method thereof according to the present invention can also enlarge the visible area, which provides greater convenience to the user. For the implementation of the present invention, the manufacturing method enjoys the benefits of screen printing and exposure/development; hence power consumption problems can be avoided, as opposed to the conventional thermal curing process where the power consumption is generated by using an oven for a long time. Therefore, the environmental protection requirements can also be met.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A touch panel, comprising:
   a substrate, having a transparent conductive pattern;
   a peripheral circuit, connected with the transparent conductive pattern; and
   a masking decoration layer, disposed next to a terminal of the transparent conductive pattern;
   wherein the peripheral circuit is behind the entire masking decoration layer;
   wherein the peripheral circuit comprises cured parts of a radiation curable conductive material.

2. The touch panel of claim 1, wherein a wire width of the peripheral circuit is less than or equal to about 70 micrometers.

3. The touch panel of claim 1, wherein the radiation curable conductive material comprises radiation curable silver glue, radiation curable silver paste or radiation curable ink.

4. The touch panel of claim 1, wherein the substrate is a transparent plastic substrate, a transparent glass substrate or a PET thin film substrate.

* * * * *